United States Patent [19]
Singh et al.

[11] Patent Number: 6,162,697
[45] Date of Patent: Dec. 19, 2000

[54] HIGH Q INDUCTOR REALIZATION FOR USE IN MMIC CIRCUITS

[75] Inventors: Rajinder Singh; Kai Tuan (Kelvin) Yan, both of Singapore, Singapore; Junichi Shibata, Tokyo, Japan

[73] Assignees: Institute of Microelectronics; Oki Techno Centre Pte Ltd., both of Singapore, Singapore

[21] Appl. No.: 09/170,733

[22] Filed: Oct. 13, 1998

[51] Int. Cl.[7] .................................................. H01L 21/20
[52] U.S. Cl. ......................... 438/381; 438/142; 438/197
[58] Field of Search ................................... 438/382, 381, 438/106, 123, 142, 197

[56] References Cited

U.S. PATENT DOCUMENTS

| | | | |
|---|---|---|---|
| 5,221,908 | 6/1993 | Katz et al. | 330/149 |
| 5,640,127 | 6/1997 | Metz | 330/298 |
| 5,805,043 | 9/1998 | Bahl . | |
| 5,994,985 | 11/1999 | Pehlke et al. . | |

OTHER PUBLICATIONS

Jan Craninckx et al, "A1.8–GHz CMOS Low–Phase–Noise Voltage–Controlled Oscillator with Prescaler", IEEE Journal of Solid–State Circuits, vol. 30, No. 12, Dec. 1995, pp. 1474–1482.

*Primary Examiner*—Kevin M. Picardat
*Assistant Examiner*—D. M. Collins
*Attorney, Agent, or Firm*—George O. Saile; Stephen B. Ackerman

[57] ABSTRACT

Methods and structures are disclosed which realize high Q inductors to provide on-chip noise matching of microwave monolithic integrated circuits, such as low noise amplifiers and output matching networks for power amplifiers. High Q inductors, of typically 6nH, are devised by using the inductance of package leads, bondwires, electronic board trace wires and transmission lines and other components in various configurations. These and other components are serially connected starting from a chip pad, representing a circuit node, to a circuit input on a that electronic board.

6 Claims, 4 Drawing Sheets

FIG. 1 – Prior Art

HIGH Q INDUCTOR REALIZATION FOR USE IN MMIC CIRCUITS

BACKGROUND OF THE INVENTION

1. Field of the Invention

The invention relates to realizing high Q inductors and more particularly to realizing high Q inductors for on-chip input matching of microwave monolithic integrated low noise amplifiers or output matching networks for power amplifiers.

2. Description of the Related Art

Off chip noise tuning for Low Noise Amplifiers (LNAs) is a tedious activity and has the problem with repeatability, though its final noise figure can be lower since the Q of off-chip inductors is higher. Similarly, on-chip output matching for power amplifiers (PAs) is also desirable from a manufacturing point of view, but results in additional loss due to the low Q of on-chip inductors, considering the low Q of LNAs. Most off-chip matching will require additional external components, while it is, of course, far more desirable to have complete on-chip noise matching. The use of low cost plastic packages introduces undesired effects which make the requirement for a more robust design even more difficult to achieve. Most of the present designs in the open literature lack robustness which drives manufacturers to select a more expensive off-chip matching approach. Another important challenge in microwave monolithic integrated circuit (MMIC) design is the reduction of the number of inductors used on-chip. Other components, like resistors and capacitors, which require less area should be used in place of inductors whenever possible.

Most of the past solutions on input noise matching lack robustness. Therefore, manufacturers usually preferred off-chip matching for better control over the overall noise figure. An example is the circuit of FIG. 1, where the noise match 10 is done off-chip. However, off-chip noise tuning is an expensive and tedious process in which numerous iterations of printed circuit board (PCB) modifications were needed, especially if the inductance is realized off-chip. Some of the past solutions include physical cutting of the PCB in order to achieve the desired inductance value of L1 and L2 as shown in FIG. 2. FIG. 2 depicts an inductor 21 and its corresponding implementation as a PCB transmission line 22, with terminals 1 and 2 for both. For the best possible noise match the S11 and Sopt (optimum noise position) are a conjugate match, which is equal in magnitude but opposite in phase. Craninckx and Steyaert (Jan Craninckx and Michel S. J. Steyaert, "A 1.8-GHz CMOS Low-Phase-Noise Voltage-Controlled Oscillator with Prescaler", pp. 1474–1482, IEEE Journal of Solid-State Circuits, Vol. 30, NO. 12, December 1995) have suggested a method of using bondwire to create the desired high Q inductor, but for low phase noise voltage controlled oscillator applications.

U.S. Pat. No. 5,640,127 (Metz) discloses the use of bondwire for an inductor, but for input protection for a high bandwidth amplifier, which differs from the invention. U.S. Pat. No. 5,221,908 (Katz) also describes the use of bond wire for an inductor as a gate impedance, but in the context of a distortion equalizer.

SUMMARY OF THE INVENTION

It is an object of the present invention to provide methods and structures to realize high Q inductors for microwave monolithic integrated circuits (MMIC), such as low noise amplifiers and output matching networks for power amplifiers, that eliminate the need for expensive and tedious off-chip tuning.

Another object of the present invention is to improve repeatability of component parameters.

A further object of the present invention is to provide complete on-chip noise matching.

A yet further object is to improve the noise figure and the gain of MMICs which are matched to the high Q inductor of the present invention.

These objects have been achieved by using the inductance of package leads, bondwires, electronic board trace wires and transmission lines in various configurations and methods. These aforementioned components are serially connected starting from a chip pad, representing a circuit node, to a circuit input on a that electronic board.

DESCRIPTION OF THE PREFERRED EMBODIMENT

Figure 3:
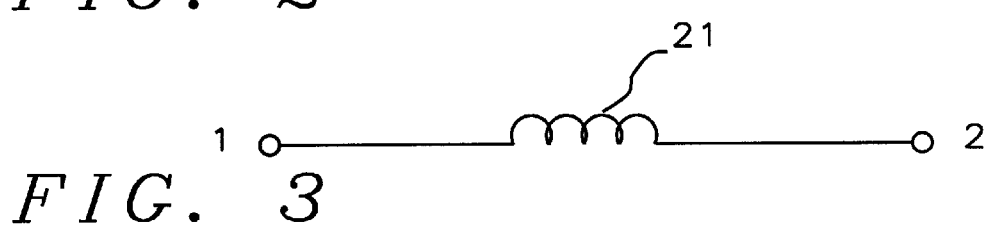
FIG. 3 depicts the equivalent high Q inductor, as realized between a terminal 1 and a terminal 2 of the electronic package of FIG. 4.

In this present invention a new way is described to realize a high Q inductor 21 for microwave frequencies which is shown in FIG. 3. Terminals 1 and 2, as shown again in FIG. 4 of the present invention, imply the beginning and end of inductor 21. A typical plastic package receive front end (RFE) monolithic microwave integrated circuit (MMIC) 40 is depicted in top view in FIG. 4. Chip 42 is shown mounted on chip carrier 41, which itself is mounted on an electronic board (not shown). To realize a large high Q inductor at input 2 of a low noise amplifier (LNA) the present invention makes use of unused package pins A, B, and C. A chip pad, equalling terminal 2 of the conductor, is first bonded via bondwire 43 to package lead 3. Pad 3 connects to package pin A, via package lead 44, which is connected externally via a trace 45 on a printed circuit board (PCB) to package pin B. Pin B connects, via package lead 46, to pad 4, which is connected via bondwire 47 to pad 5. Pad 5 connects, via package lead 48 to the last used package pin C, which is connected via trace 49 on the PCB to input node 1. Input node 1 is terminal 1 of inductor 21 and is also input IN of FIG. 5.

A high Q inductor is thus realized through a combination of multiple bondwires, package pins and PCB traces. This is a preferred embodiment of the present invention but those skilled in the art will realize that many other combinations of the above method are possible. The PCB substrate may be substituted by many other generic materials suitable for packaging a semiconductor chip and includes, but is not limited to, materials such as ceramic substrate material or other multi-chip module or multi-layer-ceramic substrate material. It is understood that the sequence and number of bondwires 43 and traces 45 can vary to produce the desired inductor value and to suit the particular chip and chip carrier and the number of unused chip pads and unused package pins.

Another method of implementing an inductor is, still using the same arrangement of chip, chip carrier and PCB, to connect a chip pad through a bondwire or other means to an interposer or a series of interposers. The last connected interposer is then connected to one of the unused package leads which then connects to input node 1, similar to the method described above. This method of using one or a sequence of interposers connecting from a chip pad to the input node also constitutes an inductor.

We now describe a structure for a high Q inductor with a terminal 1 and a terminal 2, where the inductor connects at terminal 2 to a node of a high frequency circuit. Using a semiconductor chip with a plurality of chip pads and the chip mounted on a chip carrier with package leads, the chip pad representing the node of the high frequency circuit, and also terminal 2 of the proposes inductor, a series of connections can be made through connecting means which equal an inductor at high frequency having a high Q. The connection goes from the chip pad via a bondwire to a package lead, from there to a pin at the other end of the package lead. The pin is connected via connecting means such as wire trace on a PCB to another pin. The other end of that pin connects via a package lead to a pad, which is connected through connecting means such as a bondwire to yet another pad. This pad connects via a last package lead to a final pin, which is connected to one of the input nodes on the PCB; that input node equaling terminal 1 of the inductor and input IN of the high frequency circuit. Those skilled in the art understand that the sequence and number of bondwires and wire traces can vary to produce the desired inductor value and to suit the particular chip and chip carrier and the number of unused chip pads and unused package pins.

Figure 4:
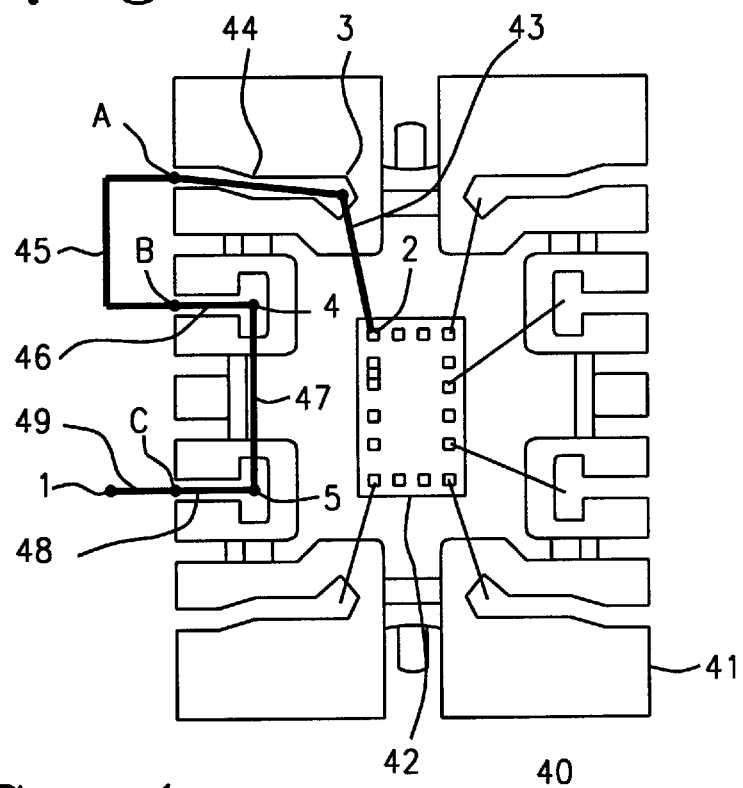
FIG. 4 is a top view of a high Q inductor realization for a typical receive front end microwave monolithic integrated circuit as implemented on a 16 pin SSO package.
Figure 5:
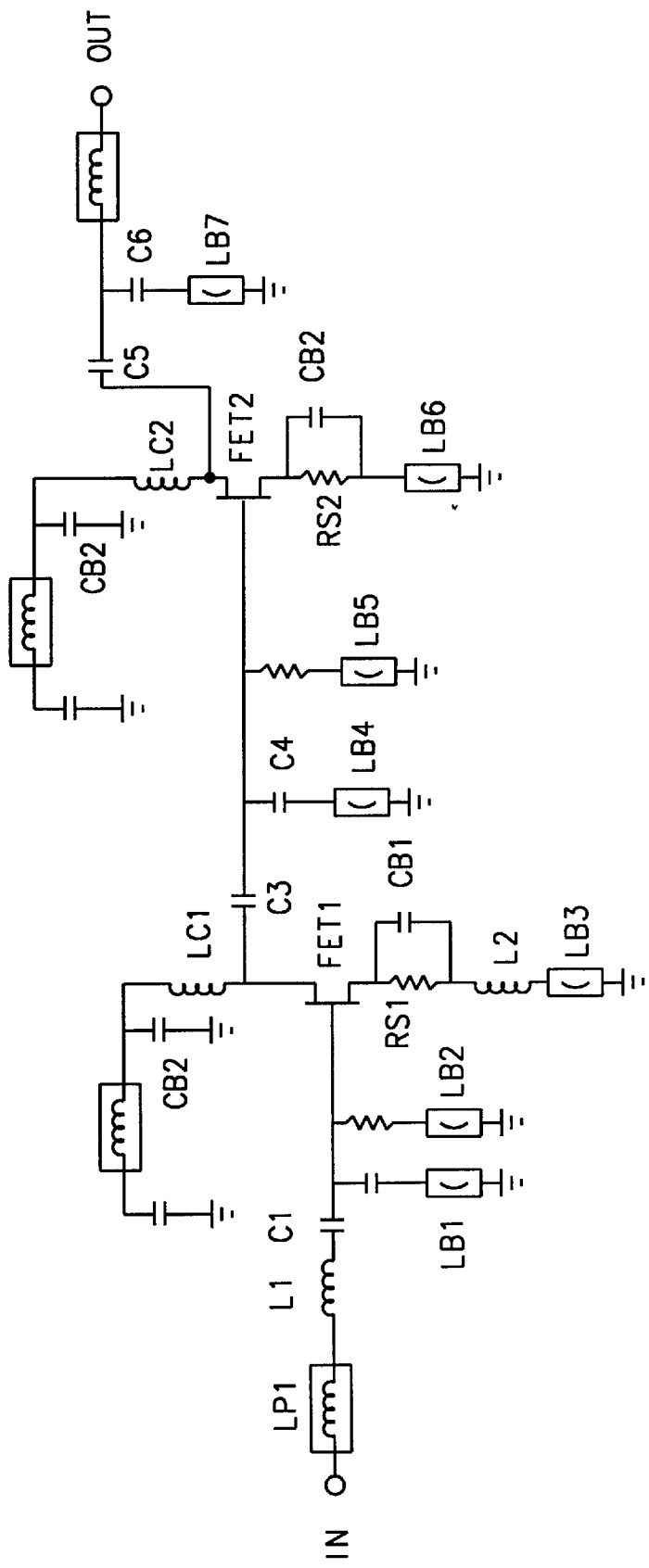
FIG. 5 is a circuit diagram of a fully integrated 2-stage low noise amplifier of the present invention including the front end high Q inductor.
Figure 6:
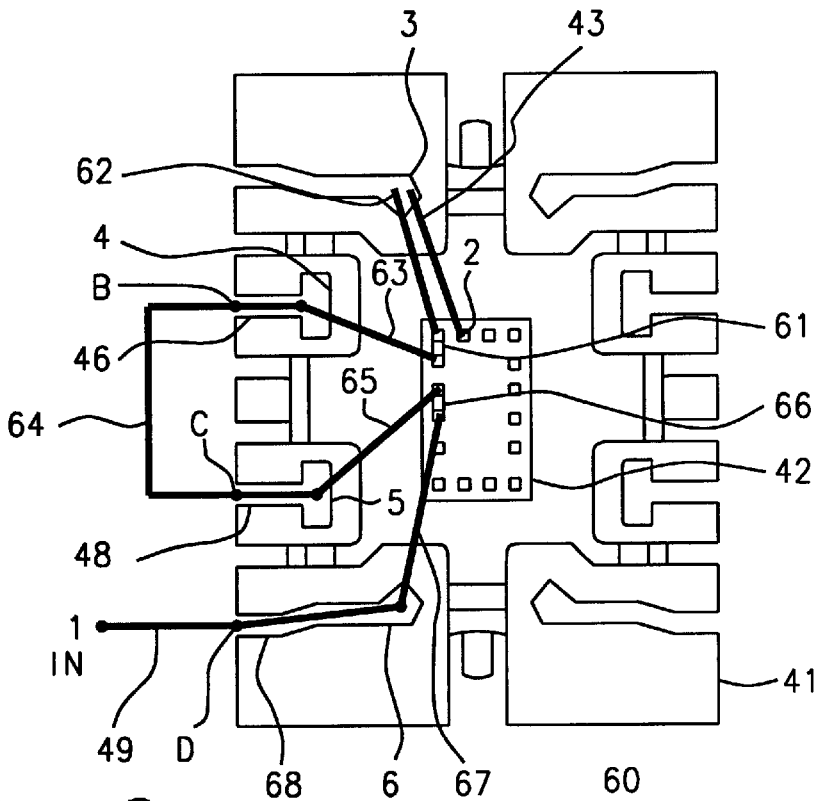
FIG. 6 is a top view of another implementation of a high Q inductor similar to FIG. 4, but using extra bondpads on the chip die.

A second preferred embodiment of the structure of FIG. 4 is shown in FIG. 6. Similar to FIG. 4, chip package 60 shows chip 42 mounted on chip carrier 41. Chip pad 2, representing the node of the high frequency circuit and equal to terminal 2 of the proposed inductor, is connected via connecting means, typically a bondwire 43, to a pad 3. Pad 3 also connects to two joined chip pads 61 via bondwire 62. From pad 61 a bondwire 63 connects to pad 4 of package lead 46. Pin B of lead 46 connects through trace wire 64 to pin C of package lead 48. Pad 5 of lead 48 connects via bondwire 65 to chip pad 66. Chip pad 66 connects back to unused pad 6 via bondwire 68. Pad 6 connects to pin end D of package lead 68 and pin D then connects via trace wire 49 to input node 1, which is the input IN. Again input IN of FIG. 6 is input IN of the high frequency circuit as shown in FIG. 5.

Figure 7:
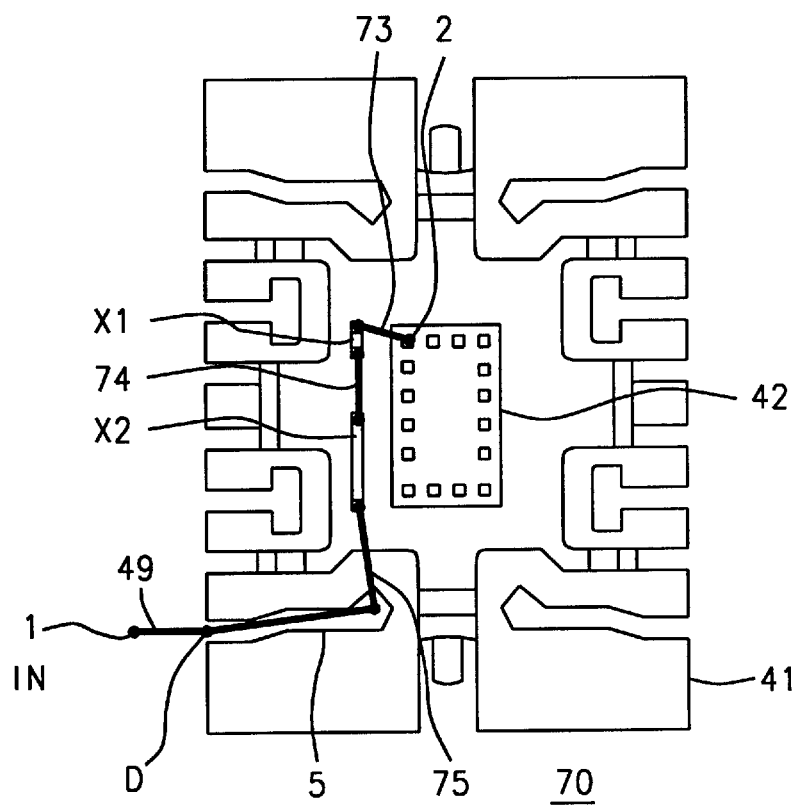
FIG. 7 is a top view of yet another implementation of a high Q inductor similar to FIG. 4, but using interposer posts.

High Q inductors can also be achieved by utilizing a plurality of interposers, located in the space between the chip and the chip carrier. Referring now to FIG. 7, we show a third preferred embodiment of the present invention. Chip package 70 shows chip 42 mounted on chip carrier 41. Chip pad 2 representing the node of the high frequency circuit, and equal to terminal 2 of the proposed inductor, is connected via connecting means, typically a bondwire 73, to a first interposer X1. Depending on the size of the inductor required, a second bondwire 74 connects to a second interposer 74. From this second interposer another connection is made, again typically with a bondwire 75 to an unused pad 5 of a package lead on the chip carrier. The pin end D of that package lead then connects, typically through a trace wire 49 on the PCB, to an input node 1, which is the input IN. Again input IN of FIG. 7 is input IN of the high frequency circuit as shown in FIG. 5.

Referring now again to FIG. 5, we describe a circuit utilizing the features associated with this present invention. A two stage low noise Gallium-Arsenide metal epitaxial field effect transistor (GaAs MESFET) amplifier with complete on-chip matching, through the use of the invention's high Q inductor, is implemented. This low noise amplifier is capable of a noise figure of less than 1.4 dB, but typically less than 1.0 dB and a gain of typically 24 dB, with a range from 22 dB to 26 dB.

Figure 2:
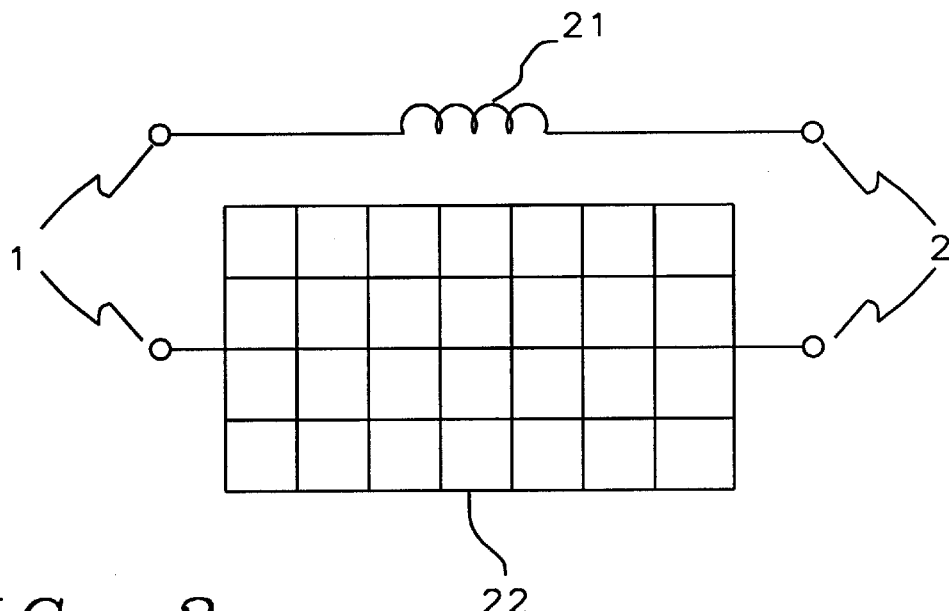
FIG. 2 shows a schematic of an inductor and its high Q implementation using a transmission line on a printed circuit board.

Although this low noise amplifier is designed and optimized for the Japanese 1.9 GHz Personal Handy System (PHS) frequency, it can be easily tuned to function at other wireless applications of frequencies from 800 MHz to 5.8 GHz. Although the present chip is designed to be fitted into a cheap plastic package for low cost manufacturing, the same technique can also be applied to other types of packages. The low noise characteristic is primarily obtained by the inclusion of LP1 and L1, which has the effect of shifting of the Sopt (optimum noise position) and S11 close to the center of the Smith chart. This has the combined effect of giving a low noise performance as well as a good input voltage standing wave ratio (VSWR). High gain can now be obtained since the input VSWR has improved. This effect of low noise and high gain at the same time is desired in all low noise amplifiers. High Q inductance is being achieved from the plastic package lead inductance by this present invention of connecting unused lead pins in series through bondwires, PCB trace wires and/or PCB transmission lines. The latter as shown in FIG. 2. For this design, the inductive feedback provided by L2 at the source of FET1 has the secondary effect of improving the noise match. L2 is also needed for stability reasons. The technology used in this circuit design is 0.5 micron depletion mode GaAs MESFET.

Still referring to FIG. 5, the two-stage low noise amplifier (LNA) consists primarily of two FETs of 150 micron width connected in series. The present scheme will also work for a single stage LNA with a reduction in overall gain. The high gain and the low noise of this LNA will minimize the noise contribution of the mixer circuit when the present circuit is used as part of a receive front end. Wire bonds denoted by LB1 through LB7, as shown in FIG. 5 and as taught in this invention, are considered in the design. The on-chip Vdd bypass capacitors CB1 and CB2 have a value of 15 pF. The Vdd lines are kept separate for stability reasons. Both FET1 and FET2 are self-biased through 20K ohm resistors RS1 and RS2, respectively. LC1 and LC2 are choke inductors which provide adequate RF signal isolation. C3 and C4 are adjusted for good interstage matching. A good output match can be obtained by adjusting C5 and C6. C1, C3 and C5 are DC blocks as well as part of the matching networks. The inductive feedback of L2, which is designed for 2.4 nH is rather robust against process variations.

Figure 1:
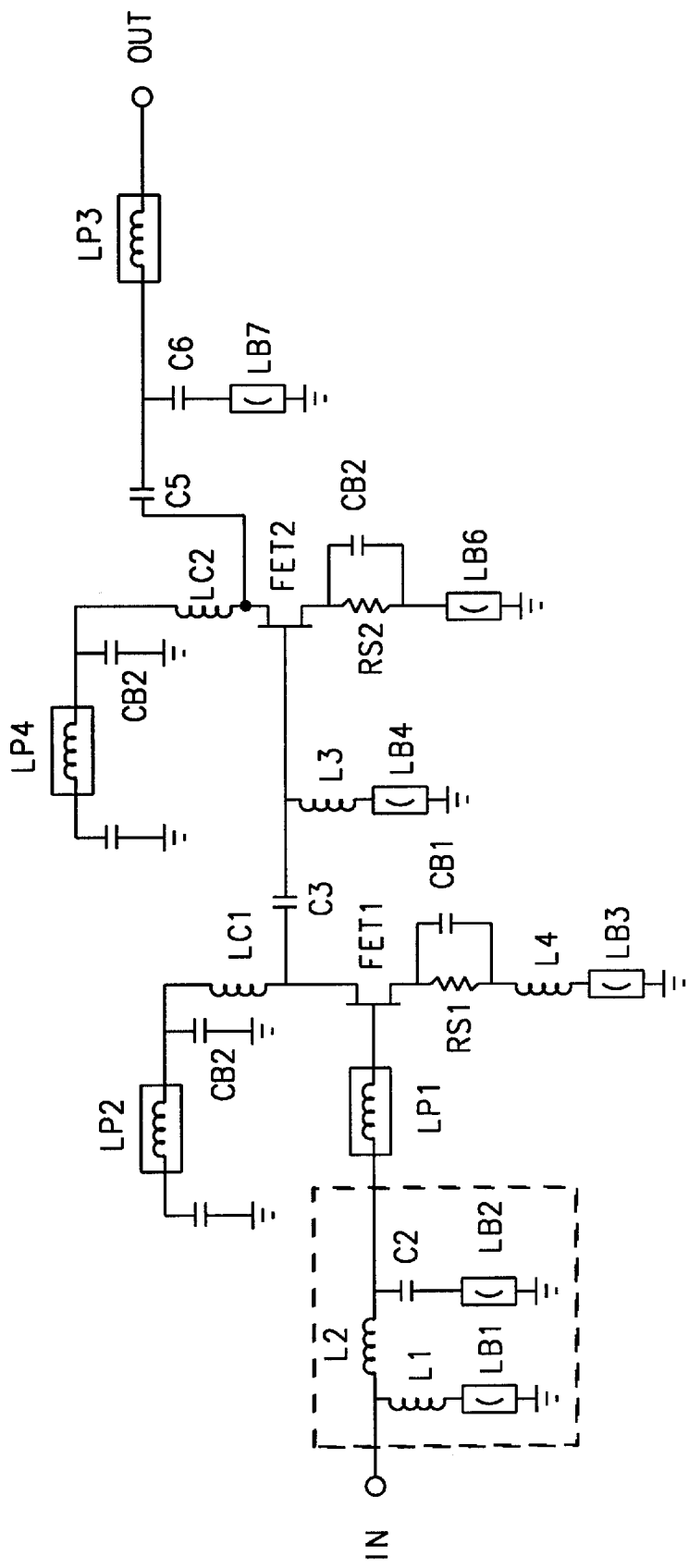
FIG. 1 is a circuit diagram showing input matching of the prior art.

The package, as used and shown in this invention as an illustration, is a 16 pin SSOP plastic package. The LP1 of FIG. 1 is implemented similarly in FIG. 4. A minimum of three lead pins is needed to implement the high Q inductance of 6 nH of LP1. This method can be further extended to a maximum utilization by connecting in series unused pins D and E as shown in FIG. 4. The heavy line shows the actual path to realize LP1. It is a fast method to getting very high Q inductors without using on-chip inductors of very wide width, which would be a waste of real estate on a GaAs chip. Although this method of realizing a high Q inductor is applied to a LNA, it can be easily extended to other circuits, like mixers, power amplifiers, etc.

The high Q LP1 is realized by using a combination of the package lead inductance, the PCB's transmission line and bondwires. L1 has a value of 5nH with a lossy R component of 5 ohms. Therefore, a total inductance of LP1+L1 of 11 nH can be obtained. With a lossy R of 5 ohm, the L1 inductor is easily achieved by a small spiral inductor of 10 micron width and a spacing of 4 microns. This smaller inductor has a 50% reduction in area compared with a lower loss inductor with R of 2.5 ohm, a width of 30 micron and a spacing of 4 micron. In addition, the smaller inductor produces a higher resonant frequency of more than 8 GHz, instead of 6 GHz for a width of 30 micron, which also means a greater safety margin for process variations. Thus, this unique implementation of LP1 results in a substantial area saving as part of the required inductor is moved off-chip.

The circuit is very robust against any variations which may cause the total input inductance to vary. The higher the total input inductance, the better. However, a reduction may cause the noise figure to increase somewhat. In fact, the worst noise figure is less than 2 dB, which is still very much within the worst case specification of 4 dB for a PHS application.

Even in the event that the total input inductance falls short of the target, the presence of unused pins D and E will enable the tuning for an optimum noise figure by changing the pin's bonding configurations.

While the invention has been particularly shown and described with reference to the preferred embodiments thereof, it will be understood by those skilled in the art that various changes in form and details may be made without departing from the spirit and scope of the invention.

What is claimed is:

1. A method of connecting unused pins of an electronic package to implement an inductor, comprising:

providing a semiconductor chip with a plurality of chip pads;

mounting said semiconductor chip on a chip carrier;

providing said chip carrier with a plurality of package leads;

mounting said chip carrier on an electronic board via said package leads;

providing said electronic board with a plurality of input nodes;

connecting at least one of said chip pads to one of said package leads;

connecting at least one pair of package leads; and connecting the last of a pair of said connected package leads to said input node.

2. The method of claim 1, further comprising connecting a prior connected package lead to a subsequent package lead.

3. The method of claim 1, wherein said sequence of connections from said chip pad to said input node constitutes an inductor.

4. A method of connecting unused pins of an electronic package to implement an inductor, comprising:

providing a semiconductor chip with a plurality of chip pads;

mounting said semiconductor chip on a chip carrier;

providing said chip carrier with a plurality of package leads;

mounting said chip carrier on an electronic board via said package leads;

providing said electronic board with a plurality of input nodes;

connecting at least one of said chip pads to an interposer;

connecting at least one pair of said interposers;

connecting the last of a pair of said connected interposers to one of said package leads; and connecting said package lead to one of said input nodes.

5. The method of claim 4, further comprising connecting a prior connected interposer pad to a subsequent interposer pad.

6. The method of claim 4, wherein said sequence of connections from said chip pad to said input node constitutes an inductor.

* * * * *